United States Patent [19]

Gupta

[11] Patent Number: 5,761,226

[45] Date of Patent: Jun. 2, 1998

[54] FREQUENCY CONVERSION LASER DEVICES

[75] Inventor: Mool C. Gupta, Webster, N.Y.

[73] Assignee: Eastman Kodak Company, Rochester, N.Y.

[21] Appl. No.: 654,941

[22] Filed: May 29, 1996

[51] Int. Cl.$^6$ ...................................................... H01S 3/10
[52] U.S. Cl. ........................................................ 372/22
[58] Field of Search ........................... 372/22, 6; 359/326, 359/328

[56] References Cited

U.S. PATENT DOCUMENTS

| | | | |
|---|---|---|---|
| 4,474,427 | 10/1984 | Hill et al. | 350/96.3 |
| 5,036,220 | 7/1991 | Byer et al. | 307/427 |
| 5,157,754 | 10/1992 | Bierlein et al. | 385/122 |
| 5,193,023 | 3/1993 | Yamada et al. | 359/245 |
| 5,249,250 | 9/1993 | Yamada et al. | 385/122 |
| 5,321,718 | 6/1994 | Waarts et al. | 372/22 |
| 5,367,588 | 11/1994 | Hill et al. | 385/37 |
| 5,373,526 | 12/1994 | Lam et al. | 372/22 |
| 5,659,559 | 8/1997 | Ventrudo et al. | 372/102 |

OTHER PUBLICATIONS

Yuhuan Xu, Ferroelectric Materials and Their Applications, Elsevier Science Publishers B.V. 1991, 233 Chapter 1 of Boyd, Nonlinear Optics (1992) No Month.

*Primary Examiner*—Rodney B. Bovernick
*Assistant Examiner*—Robert E. Wise
*Attorney, Agent, or Firm*—Raymond L. Owens

[57] ABSTRACT

A frequency converting laser device includes a plurality of laser diodes each adapted to produce an output laser light beam and a plurality of optical fibers, each coupled to the output of a corresponding laser diode and including a built-in grating in the optical fiber arranged so as to provide a beam having a specific wavelength and to reflect a small portion of such beam back into the laser diode while transmitting the beam so that the laser diode will produce a beam of that wavelength. The device further includes frequency converting structure adapted to receive the transmitted beams of laser light and to change the frequency of each input beam to produce output beams at desired frequencies.

4 Claims, 2 Drawing Sheets

FREQUENCY CONVERSION LASER DEVICES

CROSS-REFERENCE TO RELATED APPLICATIONS

Reference is made herein to commonly assigned U.S. patent application Ser. No. 08/643,243 filed May 3, 1996 (now U.S. Pat. No. 5,682,398) and U.S. patent application Ser. No. 08/561,141 filed Nov. 21, 1995, the disclosures of which is incorporated herein by reference.

FIELD OF THE INVENTION

The present invention relates to frequency converting laser devices.

BACKGROUND OF THE INVENTION

Frequency converting laser devices such as doubling devices are used in a number of applications such as optical heads for information storage, printing devices, scanners, displays, and instrumentation. Typically a beam of light of a narrow wavelength illuminates a nonlinear crystal which doubles the output frequency of the light, for example, typically the input light beam can be an infrared region and the output light will be in the visible portion of the spectrum. For example, if a 980 nm laser wavelength light is passed through a nonlinear crystal such as $LiTaO_3$ then blue wavelength light of 490 nm can be achieved. For efficient conversion of frequency doubled light the so-called phase matching conditions have to be satisfied. Various methods are used to satisfy the phase matching condition. These methods include passing light through nonlinear crystal at specific angle or passing light through a periodically arranged zones of inverted polarity of ferroelectric domains in the crystal. In such cases the specific angle used for passing light through the crystal or the period of the inverted polarity zones determines the specific wavelength of the incident light that can be phase matched. In general, the phase matching wavelength has to be very precise and any deviation from the optimum value will cause significant loss of frequency doubled light or even could occur essentially a complete loss. Typically, the wavelength of the laser has to stay with in a fraction of a 1 nm from the optimum phase matching wavelength. For example, if input laser beam wavelength is 980 nm for optimum phase matching condition then any deviation such as 979 or 981 nm could destroy the phase matching condition. This requirement puts a stringent condition on input laser sources for frequency doubled light.

If an ordinary semiconductor laser is used for the light source, then wavelength fluctuations due to temperature or light feedback to laser could make the frequency of the output beam unsuitable for frequency converting laser device structures. Some schemes such as putting a bulk grating in the optical path to wavelength stabilize the laser have been discussed. But these are harder to use for alignment purposes and are bulky making devices very expensive and inconvenient. Other laser sources such as distributed feedback (DFB), Distributed Bragg reflected (DBR) lasers can be used for frequency converting laser devices. These lasers are harder to fabricate and very expensive and draw significant amount of current to achieve significant power from these lasers.

It is frequently desirable in printing, optical storage, and display technologies to provide a plurality of output laser beams with each output beam having a desired frequency. In some cases, it is desirable where the frequency be the same wherein other cases, they should be different.

SUMMARY OF THE INVENTION

An object of the present invention is to provide an improved frequency converting laser device which provides a plurality of frequency converted laser light beams.

This object are achieved in a frequency converting laser device, comprising:

a) a plurality of laser diodes each adapted to produce an output laser light beam;

b) a plurality of optical fibers, each coupled to the output of a corresponding laser diode and including a built-in grating in the optical fiber arranged so as to provide a beam having a specific wavelength and to reflect a small portion of such beam back into the laser diode while transmitting the beam so that the laser diode will produce a beam of that wavelength; and c) a frequency converting structure adapted to receive the transmitted beams of laser light and to change the frequency of each input beam to produce output beams at desired frequencies.

In another aspect of the invention, a frequency converting laser device, comprising:

a) a single laser diode adapted to produce an output laser light beam;

b) a first optical fiber coupled to the output of the laser diode and including a built-in grating in the optical fiber arranged so as to provide a beam having a specific wavelength and to reflect a small portion of such beam back into the laser diode while transmitting the beam so that the laser diode will produce a beam of that wavelength;

c) a plurality of second fiber optics each coupled to the first fiber optic and for directing a separate beam of laser light; and c) a frequency converting structure adapted to receive the separate beams of laser light and to change the frequency of each of those separate beams to produce output beams at a desired frequency.

Advantages

An advantage of the present invention is to provide an effective structure for providing a plurality of frequency converted output laser light beams.

Another advantage of the present invention is that it permits the use of an inexpensive laser diodes light source in a frequency converting laser device. Laser diodes devices have heretofore been unsuitable for use in frequency doubling since their output includes many wavelengths of light.

DETAILED DESCRIPTION OF THE INVENTION

In accordance with the present invention, laser diodes can be used in frequency converting laser devices. The present invention makes use of optical fibers which receive the output of a semiconductor laser diode. The optical fibers are single mode fibers. A grating is formed inside the core of the fiber by ultraviolet light exposure. The grating inside the fiber reflects a small fraction of light of particular wavelength to the semiconductor laser to lock the wavelength of the semiconductor laser. Such lasers are now commercially available for optical communication application. Here we describe a frequency doubling laser device using such fiber lasers.

Figure 1:
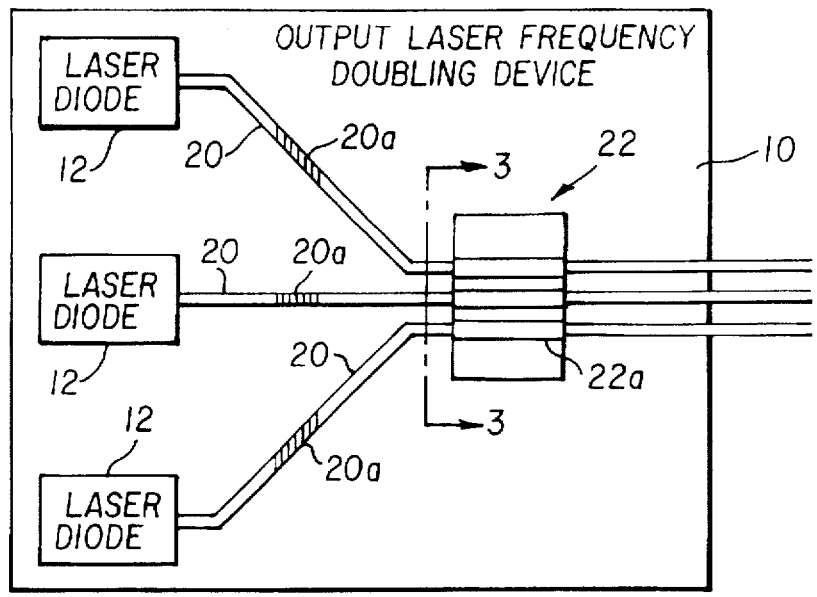
FIG. 1 shows a plan view of apparatus in accordance with the present invention which includes a plurality of laser diode output devices and which produces multiple output beams.
Figure 2:
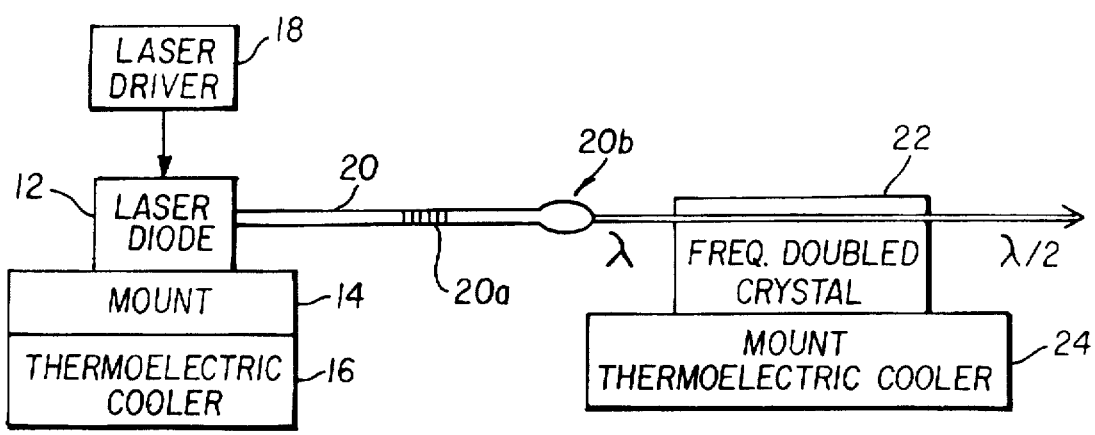
FIG. 2 shows in cross section a single frequency conversion laser device of FIG. 1 with a lens being formed on the end of an optical fiber.

Turning first to FIGS. 1 and 2, there is provided an output laser frequency doubling device 10 wherein a plurality of a single mode semiconductor laser diode 12 is mounted on a heat conducting mount 14 and their temperatures are controlled by separate thermoelectric coolers 16 shown in FIG. 2.

As shown in FIG. 2, a laser driver 18 for each semiconductor laser diode 12 provides the appropriate drive voltage and current. An optical fiber 20 for each semiconductor laser diode 12 is shown fixed to the output its corresponding semiconductor laser diode 12 and is preferably a single mode fiber. Each optical fiber 20 has a built-in grating 20a inside its core area. The index of refraction of the optical fiber can be controlled by stressing the optical fiber 20 or by changing the temperature of the optical fiber 20. In this way, small changes can be made in the frequency of the light produced by the semiconductor laser diode 12. These optical fibers, which include gratings, are well known in the art and for discussion of their operation in connection with a single mode laser, reference is made to U.S. Pat. Nos. 4,474,427 and 5,367,588, the disclosures of which are incorporated by reference herein. The built-in gratings 20a can be selected for each semiconductor laser diode 12 so that the output beam of light from the optical fiber 20 is of a single frequency of a particular wavelength. A small portion of the light beam is reflected by the grating back into the laser diode while transmitting the beam so that the laser diode will produce a beam of that wavelength.

A frequency conversion structure 22 is mounted on a substrate which is mounted on a thermoelectric cooler 24. In FIG. 1 a plurality of waveguides 22a is included as part of the frequency conversion structure 22. It is preferable that the waveguide 22a be made of a nonlinear crystal. The output light from each optical fiber 20 is collimated or focused by a lens formed in the free end portion of each optical fiber 20 and passes through its waveguide frequency conversion structure 22 which upconverts the frequency of the light. As shown, the end of the optical fiber 20 is provided in the shape of a lens so that a collimated or focusing beam emerges from the optical fiber 20. For example, if the input light to the frequency conversion structure 22 is in the infrared region, the output light can be in the blue region of the spectrum. In other words, the frequency is doubled. By using an optical fiber 20, the light beam from each semiconductor laser diode 12 does not diverge over the length of the optical fiber 20.

Frequency doubling structures are well known in the art and may take a number of different forms. Single crystal materials such as LiNbO$_3$, LiTaO$_3$, and KTP have been used in the past for frequency doubling. See, for example, Yuhuan Xu, Ferroelectric Materials and Their Applications, Elsevier Science Publishers B.V. 1991, 233. Moreover, inverted ferroelectric domain regions can also be used to double the frequency of input light. See, for example, the above-referenced commonly assigned Baron et al U.S. patent application Ser. No. 08/561,141 filed Nov. 21, 1995. For further examples of disclosures of devices which use ferroelectric domain structures to provide a frequency doubling function, see U.S. Pat. Nos. 5,157,754 issued Oct. 20, 1992 to Bierlein et al; U.S. Pat. No. 5,193,023 issued Mar. 9, 1993 to Yamada et al; U.S. Pat. No. 5,249,250 issued Sep. 28, 1993 to Yamada et al, and the above cross-referenced commonly assigned Baron et al U.S. patent application Ser. No. 08/561,141 filed Nov. 21, 1995, the disclosures of which are incorporated herein by reference.

Although the present invention describes a frequency doubling device based on nonlinear crystals, it will be understood by those skilled in the art that the present invention is applicable to higher harmonic generations, sum frequency generation, difference frequency generation, optical parametric oscillation using nonlinear crystal, and optical fiber laser. See, for example, Chapter 1 of Boyd, Nonlinear Optics (1992).

Single crystals are preferably used to form waveguides in the frequency conversion structure 22. The waveguides 22a are shown in FIG. 1 are preferable since a light beam is confined into small cross sectional areas say of a few microns by a few microns. For an example of a frequency doubling structure which uses such a waveguide, reference is made to U.S. Pat. No. 5,036,220 issued Jul. 30, 1991 to Byer et al, the disclosure of which is incorporated herein by reference. It is particularly effective to use such a waveguide structure with optical fibers so they can be made of small dimensions and single mode optical fibers can be sized to be compatible with the waveguide structure so that efficient coupling can be achieved.

Figure 3:
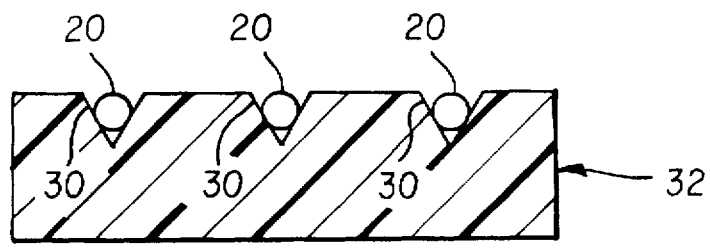
FIG. 3 is a cross sectional view taken along lines 3—3 of FIG. 1.

In FIG. 3 a cross sectional view is shown wherein each optical fiber 20 is shown in a V groove 30 on a silicon substrate 32. This V-groove arrangement can be used in the structures shown in FIGS. 1 and 2, and FIG. 4. This approach permits placement of optical fibers 20 accurately and with much ease. This arrangement, the frequency conversion structure 22 can, for example, have periodically poled domains for efficient frequency conversion. If waveguides are used in the frequency conversion structure, they must be aligned with one of the fibers placed in the V grooves 30. The spacing between the waveguides can be made equal to the spacing between the V grooves 30. In this way all of the waveguides can be aligned with their corresponding optical fiber. The light output of the waveguide can be collimated by an external lens or lens which can be attached to the output end of the fiber. Having fibers at the output end of the frequency conversion structure 22 makes use of the V grooves 30 again for ease of alignment. Also, input fiber laser source wavelengths can be matched with frequency conversion structure 22 to obtain desired wavelength or multiple wavelengths. This method can be used for frequency conversion with bulk crystals which do not have any waveguides but have periodically poled domains and light is incident at particular angle on the crystal for phase matching condition to be satisfied. Also, the frequency conversion structure can have an electrooptical modulator or beam deflector built on the same device.

Figure 4:
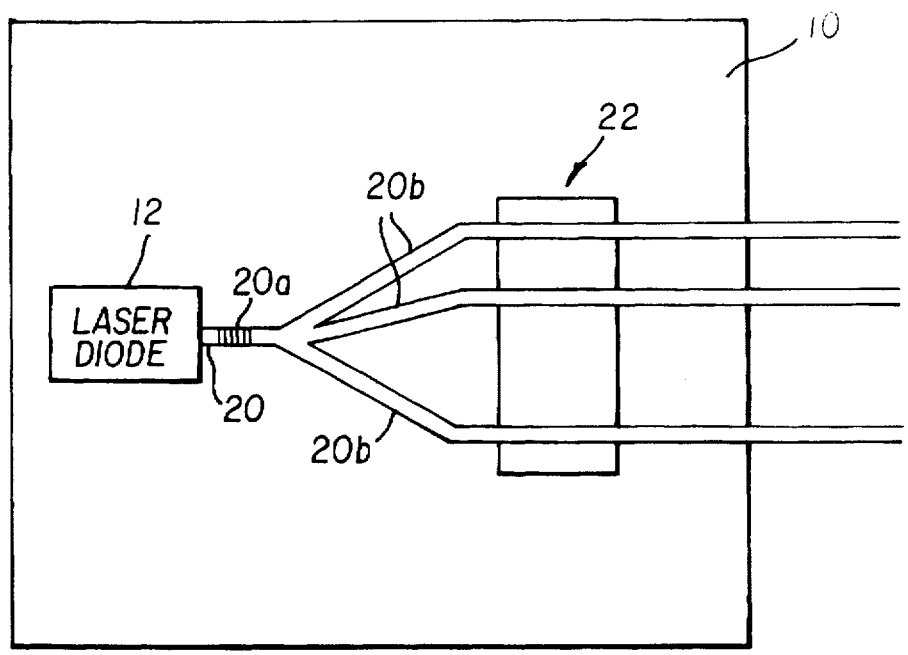
FIG. 4 shows a plan view of another embodiment of the present invention which uses a single output laser diode connected to multiple fibers.

Turning now to FIG. 4, another embodiment of the invention is shown. There is provided a single semiconductor laser diode 12 which is coupled to an output optical fiber 20 having a built-in grating 20a. The optical fiber 20 is, in turn, connected to multiple separate optical fibers 20b (three are shown). Each of these fibers 20b is mounted in the V groove 30 of the substrate 32 and delivers light to a frequency conversion structure 22. Since only a single semiconductor laser diode 12 is used, only a single built-in grating 20a need be used and the output beams from the frequency conversion structure 22 all, of course, have the same frequency.

The present invention is particularly suitable for use in a number of applications such as, for example, optical storage heads, print heads, projection displays, beam scanning apparatus, and other optical instruments.

The invention has been described in detail with particular reference to certain preferred embodiments thereof, but it will be understood that variations and modifications can be effected within the spirit and scope of the invention.

PARTS LIST 10 output laser frequency doubling device
12 semiconductor laser diode
14 heat conducting mount
16 thermoelectric cooler
18 laser driver
20 optical fiber
20a built-in grating
20b optical fibers
22 frequency conversion structure
22a waveguide
24 thermoelectric cooler
30 V groove
32 silicon substrate

I claim:

1. A frequency converting laser device, comprising:

a) laser diode means adapted to produce at least three spaced output laser beams;

b) first, second, and third optical fibers coupled to each output beam of the laser diode, each optical fiber including a built-in grating in the optical fiber arranged so as to provide a beam having a specific wavelength different than the beams provided by the other optical fibers and to reflect a small portion of such beam back into the laser diode so that the laser diode will produce a beam of that wavelength; and c) a frequency converting structure adapted to receive the transmitted beam of light and to change the frequency of each input beam to produce the output beam at the specific frequency so that the three output beams represent three different portions of the spectrum.

2. The frequency converting laser device of claim 1 further including a nonlinear frequency doubling crystal and a waveguide formed on the surface of the crystal.

3. The frequency converting laser device of claim 1 wherein the frequency doubling structure includes a crystal with inverted domain portions.

4. The frequency converting laser device of claim 1 including a substrate defining V-grooves and wherein the optical fibers are mounted in the V-grooves and frequency conversion device aligned with fibers.

* * * * *